United States Patent [19]
Behrens et al.

[11] Patent Number: 5,297,184
[45] Date of Patent: Mar. 22, 1994

[54] GAIN CONTROL CIRCUIT FOR SYNCHRONOUS WAVEFORM SAMPLING

[75] Inventors: Richard T. Behrens, Louisville; Trent Dudley, Littleton; Neal Glover, Broomfield, all of Colo.

[73] Assignee: Cirrus Logic, Inc., Fremont, Calif.

[21] Appl. No.: 12,049

[22] Filed: Feb. 1, 1993

[51] Int. Cl.⁵ .......................................... H04L 27/08
[52] U.S. Cl. .................................. 375/98; 455/234.1
[58] Field of Search ............ 375/98; 455/234.1, 240.1, 455/245.1, 247.1, 265, 260; 330/254, 278; 328/169, 173

[56] References Cited

U.S. PATENT DOCUMENTS

| | | | |
|---|---|---|---|
| 4,625,240 | 11/1986 | Yarlonski et al. | 375/98 |
| 4,634,896 | 1/1987 | Shrinkle | 307/351 |
| 4,750,058 | 6/1988 | Hirt et al. | 360/46 |
| 4,829,593 | 5/1989 | Hara | 455/234 |
| 4,864,244 | 9/1989 | Sasaki | 275/98 |
| 5,184,349 | 2/1993 | Riordan | 375/98 |

OTHER PUBLICATIONS

Cideciyan et al., "A PRML System for Digital Magnetic Recording", IEEE Journal on Selected Areas in Communications, vol. 10, No. 1, Jan. 1992.
Kato et al., "An Adaptive Equalizer for R-DAT", IEEE Transactions on Consumer Electronics, vol. 35, No. 3, Aug. 1989.
Hong et al., "An Experimental 180 Mb/sec PRML Channel for Magnetic Recording", IEEE Transactions on Magnetics, vol. 27, No. 6, Nov. 1991.
Schmerbeck et al., "A 27MHz Mixed Analog/Digital Magnetic Recording Channel DSP Using Partial Response Signalling with maximum Likelihood Detection", IEEE International Solid State Circuits Conference, 1991.
Howell et al., "Error Rate Performance of Experimental Gigabit per Square Inch Recording Components", IBM Research Report, Mar. 1990.
Coker et al., "Implementation of PRML in a Rigid Disk Drive", IEEE Trnasactions on Magnetics, vol. 27, No. 6, Nov. 1991.

*Primary Examiner*—Stephen Chin
*Attorney, Agent, or Firm*—James R. Young

[57] ABSTRACT

A mixed analog and digital gain control circuit for controlling the amplitude of an analog input signal. The circuit has a variable gain amplifier that receives the signal from a read/write recording head preamplifier. The output of the variable gain amplifier is connected through a multiplexer and equalizer to an analog to digital converter for converting the analog signal to digital sample values at controlled sampling times. A gain control circuit receives the digital values and the output of a pulse detector indicating when a pulse has occurred. A gain error detector within the gain control circuit determines the amount of error in the amplitude of each detected pulse, and this error amount is filtered and sent through a digital to analog converter and then through an exponentiating circuit. The output of the exponentiating circuit is connected to a gain control input of the variable gain amplifier.

17 Claims, 10 Drawing Sheets

GAIN CONTROL CIRCUIT FOR SYNCHRONOUS WAVEFORM SAMPLING

FIELD OF THE INVENTION

This invention relates to computer systems and more particularly to data storage and data communication devices within such computer system. Even more particularly, the invention relates to apparatus for controlling the signal level of an analog waveform being read from a recording medium of a data storage device or being received from a data communication device.

BACKGROUND OF THE INVENTION

In a magnetic disk or tape data storage device, data is commonly stored on a magnetic medium by saturation recording in which each portion of the medium is magnetized to the point of saturation in one of two directions. The data to be stored is typically encoded to satisfy certain constraints and the encoded data is used to modulate the direction of magnetization. In a coded representation known as NRZI, each "one" bit of the encoded data causes a transition in the direction of magnetization, while each "zero" bit of the encoded data causes the magnetization direction to remain unchanged. A clock signal is used to write a sequence of encoded NRZI bits as a recording head moves along a track on the medium such that one bit is written at each clock tick.

When a read head is passed over the recorded data track, a voltage pulse is produced at each transition in magnetization. Successive voltage pulses have opposite polarity since successive magnetic transitions are in opposite directions. The NRZI data sequence that was written may be reconstructed from the resulting voltage waveform by associating a "one" bit with every clock tick at which a pulse occurs and a "zero" bit with every clock tick at which no pulse occurs. The original user data may then be decoded from the NRZI data.

Similar waveforms composed of pulses sometimes occur in other applications, including data storage on optical media and data communications via modem, network, radio, or fiber-optic link.

To recover the written or transmitted data sequence, the receiver must be able to detect and time the pulses read. This requires that the amplitude of the pulses be controlled so that the pulse sent to the detection circuit and the timing recovery circuit has a consistent level.

Inter-symbol interference (ISI) occurs when pulses are placed so close together in a waveform that they overlap significantly. The position of a peak in a waveform can be shifted by ISI from other nearby pulses. Thus the recording density of a peak detection channel is limited by the fact that ISI must not be permitted to move a peak from one window to another. ISI also causes amplitude variations that must be adjusted for by a gain control circuit.

SUMMARY OF THE INVENTION

It is an aspect of the present invention to control the amplitude of signal pulses caused by bit transitions within data being read from a data storage device or data communications device.

It is another aspect of the invention to compensate the amplitude measurement to adjust for nearby pulses.

A further aspect of the invention is to adjust the amplitude by controlling the gain of a variable gain amplifier.

The above and other aspects of the invention are accomplished in the preferred embodiment in a mixed analog and digital gain control circuit for controlling the amplitude of an analog input signal. The circuit has a variable gain amplifier that receives the signal from a read/write recording head preamplifier. The output of the variable gain amplifier is connected through a multiplexer and equalizer to an analog to digital converter for converting the analog signal to digital sample values at controlled sampling times. The digital values are then passed to a pulse detector which detects pulses in the digitized signal and also passed to a timing recovery circuit which adjusts the timing of the analog to digital converter to coincide with the pulses.

A gain control circuit receives the digital values and the output of the pulse detector indicating when a pulse has occurred. A gain error detector within the gain control circuit determines the amount of error in the amplitude of each detected pulse, and this error amount is filtered and sent through a digital to analog converter and then through an exponentiating circuit. The output of the exponentiating circuit is connected to a gain control input of the variable gain amplifier.

BRIEF DESCRIPTION OF THE DRAWINGS

The above and other aspects, features, and advantages of the invention will be better understood by reading the following more particular description of the invention, presented in conjunction with the following drawings, wherein.

DESCRIPTION OF THE PREFERRED EMBODIMENT

The following description is of the best presently contemplated mode of carrying out the present invention. This description is not to be taken in a limiting sense but is made merely for the purpose of describing the general principles of the invention. The scope of the invention should be determined by referencing the appended claims.

Figure 1:
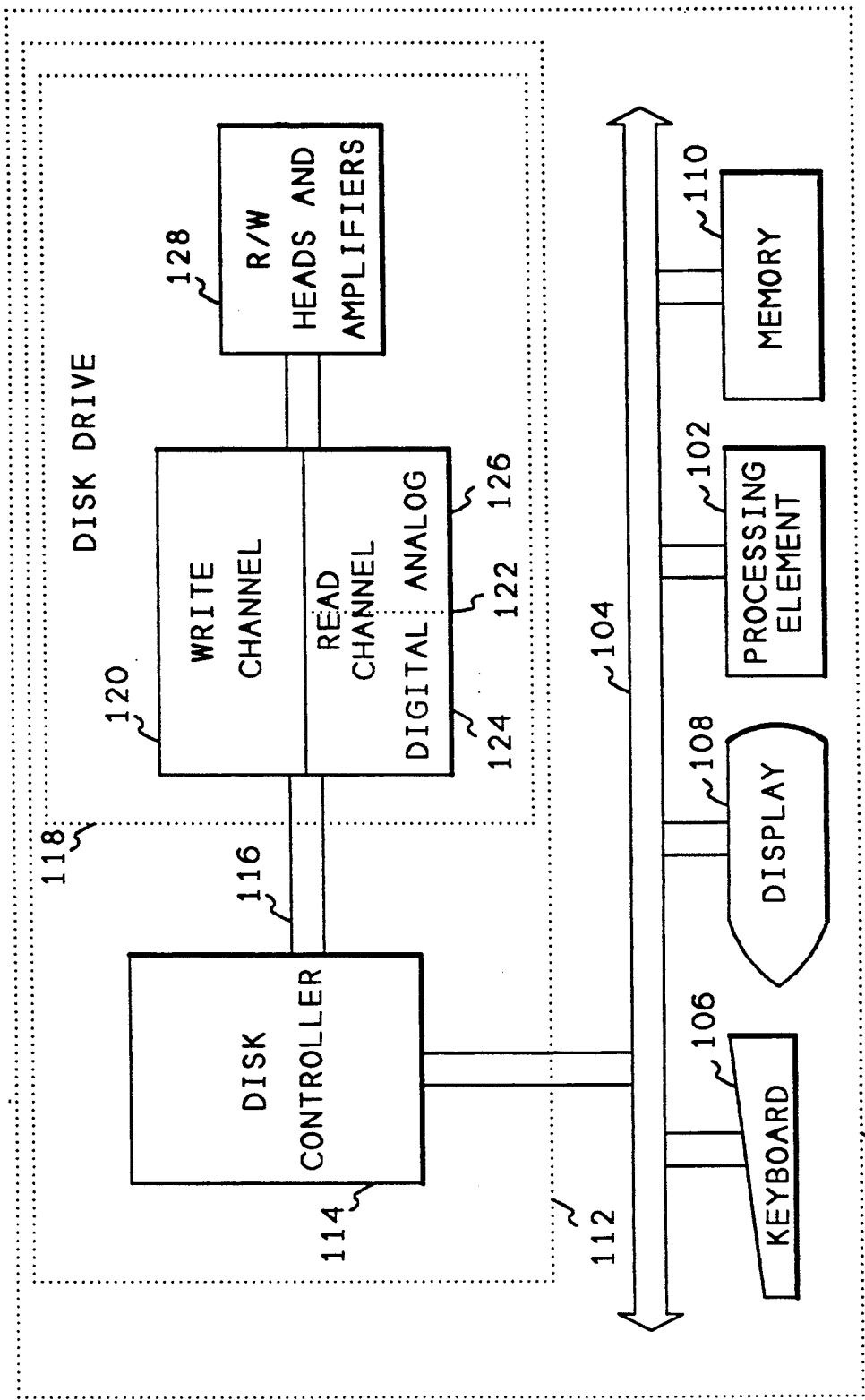
FIG. 1 shows a block diagram of the environment of the invention and illustrates the read channel that contains the invention.

FIG. 1 shows a block diagram of a typical environment of the invention. Referring now to FIG. 1, a computer system 100 contains a processing element 102 which communicates to other elements of the computer system 100 over a system bus 104. A keyboard 106 and a display 108 allow a user of the computer system 100 to communicate with the computer system 100. A memory 110 contains programs and data which cause the computer system 100 to perform operations desired by the user.

A disk data storage system 112 is connected to the system bus 104 for storing data and programs within the computer system 100. A disk controller 114 within the disk device 112 communicates to the system bus 104 and controls the operations of a disk drive 118, possibly in conjunction with a local microprocessor (not shown) within the disk data storage system 112. The disk drive 118 performs the storage function, typically storing the data on magnetic media. A bus 116 connects the disk controller 114 to the disk drive 118, specifically connecting to a write channel 120 to write data onto the disk through write heads and amplifiers 128. When data is being read from the disk through the read head and amplifiers 128 the data comes back through the read channel 122 which contains the gain control circuit of the present invention. The read and write heads may be physically the same heads. The data first passes through the analog section 126 of the read channel 122 and then through the digital section 124 of the read channel 122 before being sent on the bus 116 to the disk controller 114. After being processed by the disk controller 114, the data is then sent over the system bus 104 to the memory 110 and/or the processing element 102.

The disk controller 114 also connects to other circuits, not shown, within the disk drive 118, such as a circuit which moves the read/write heads over the surface of the data storage media.

Although not shown in FIG. 1, the gain control circuit of the present invention can be used for controlling the amplitude of pulses within data received from a transmission line, such as a telephone line or local area network, in a data communications receiver. It may also be used in any other device that must time and detect pulses within a signal.

Figure 2:
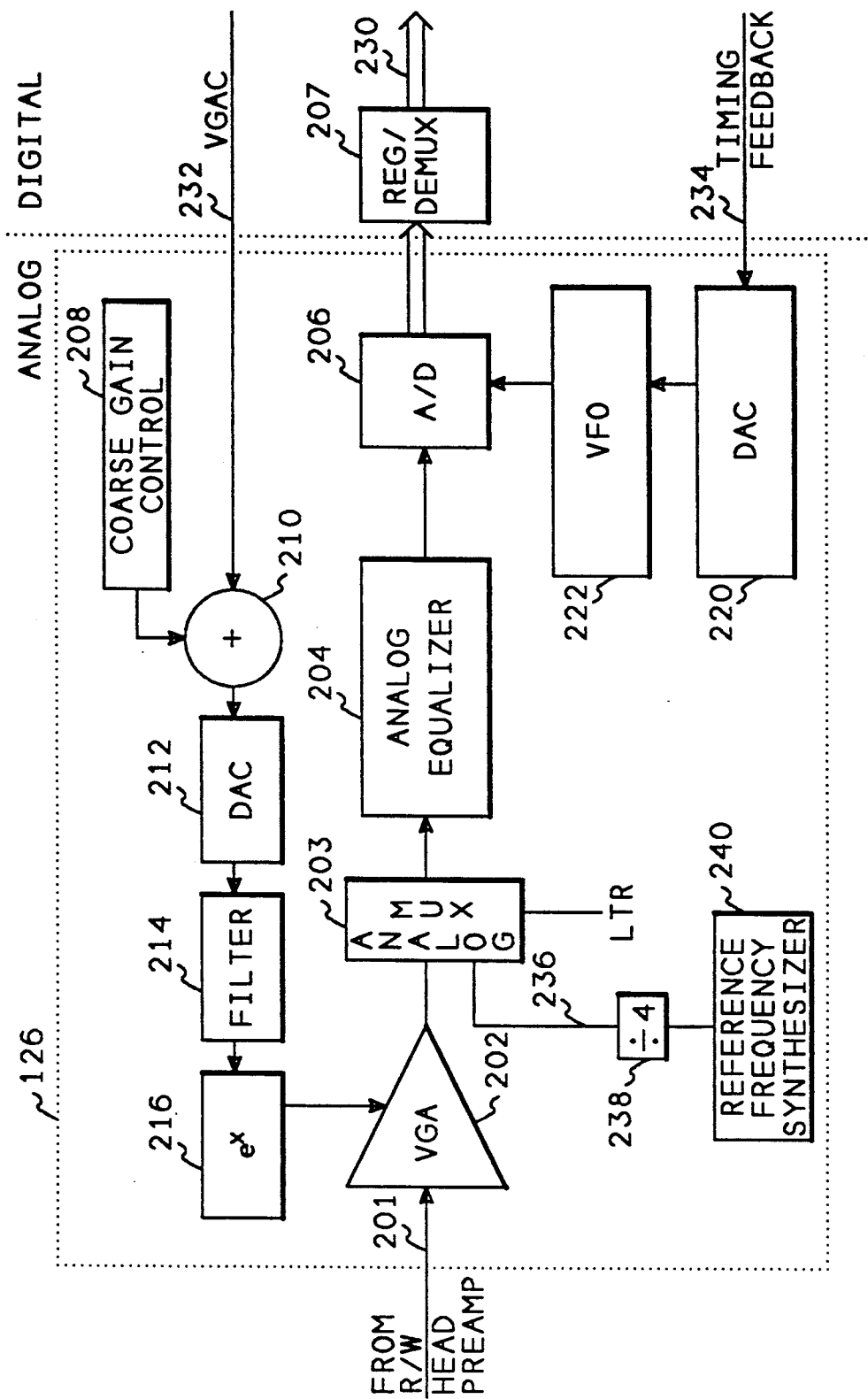
FIG. 2 shows a block diagram of the analog and analog to digital conversion circuitry of the read channel containing the invention.

FIG. 2 shows a block diagram of the analog circuitry 126 of the read channel 122. Referring now to FIG. 2, when a read head is passing over a track of the data storage medium, it picks up a signal which is amplified by a preamplifier, not shown. After this preamplification, the signal 201 is passed to a variable gain amplifier 202. The signal is further amplified by the variable gain amplifier 202 and passed through an analog multiplexer 203 and then to an analog equalizer circuit 204, which filters the signal as desired, for example, so as to remove unwanted high frequencies and shape the remaining spectrum. The output of the analog equalizer 204 is connected to an Analog to Digital converter 206. The A to D converter 206 converts the analog signal into a sequence of digital values, providing six bits of digital information per sample in the preferred embodiment, and then the data is passed to a register/de-multiplexer 207. In the preferred embodiment, the digital section 124 of the read channel 122 processes two samples in parallel. To create these two samples, the register/de-multiplexer 207 stores every other sample taken by the A to D converter 206. After the second sample is taken, the data from the two samples is passed to the data bus 230. The bus 230 is clocked by a single half-frequency clock signal.

The timing necessary for converting the data, also called taking a sample, in the A to D converter 206 is supplied by a variable frequency oscillator 222 which is controlled by the output of a digital to analog converter (DAC) 220. The input to the DAC 220 comes from the digital section of the read channel 124 as timing feedback signal 234.

The gain or attenuation of the variable gain amplifier 202 is controlled through a gain feedback signal 232 which originates in the digital portion 124 of the read channel 122. The gain feedback signal 232 is input to a summing junction 210 which has a coarse gain control value as its other input. The coarse gain control can be set by the disk controller 114, or a local microprocessor (not shown) within the disk drive, to provide a nominal gain level which is then adjusted up or down by the gain feedback signal 232. After being summed with the coarse gain control value, the feedback signal is sent to a digital to analog converter 212 and then to a filter 214. In another embodiment (not shown), the coarse gain 208 and gain feedback 232 may each be converted to analog values by separate DACs and the summing 210 done on the analog signal output of the DACs. Because of the nature of many digital to analog converters, the output of the DAC 212 may contain glitches when it is changing values. Therefore, the filter 214 may be necessary to remove these glitches in the feedback signal. After being filtered, the signal is exponentiated by the exponential converter block 216 and then connected to the variable gain amplifier 202. This conversion makes the small-signal gain control dynamics independent of the input signal amplitude.

Figure 3:
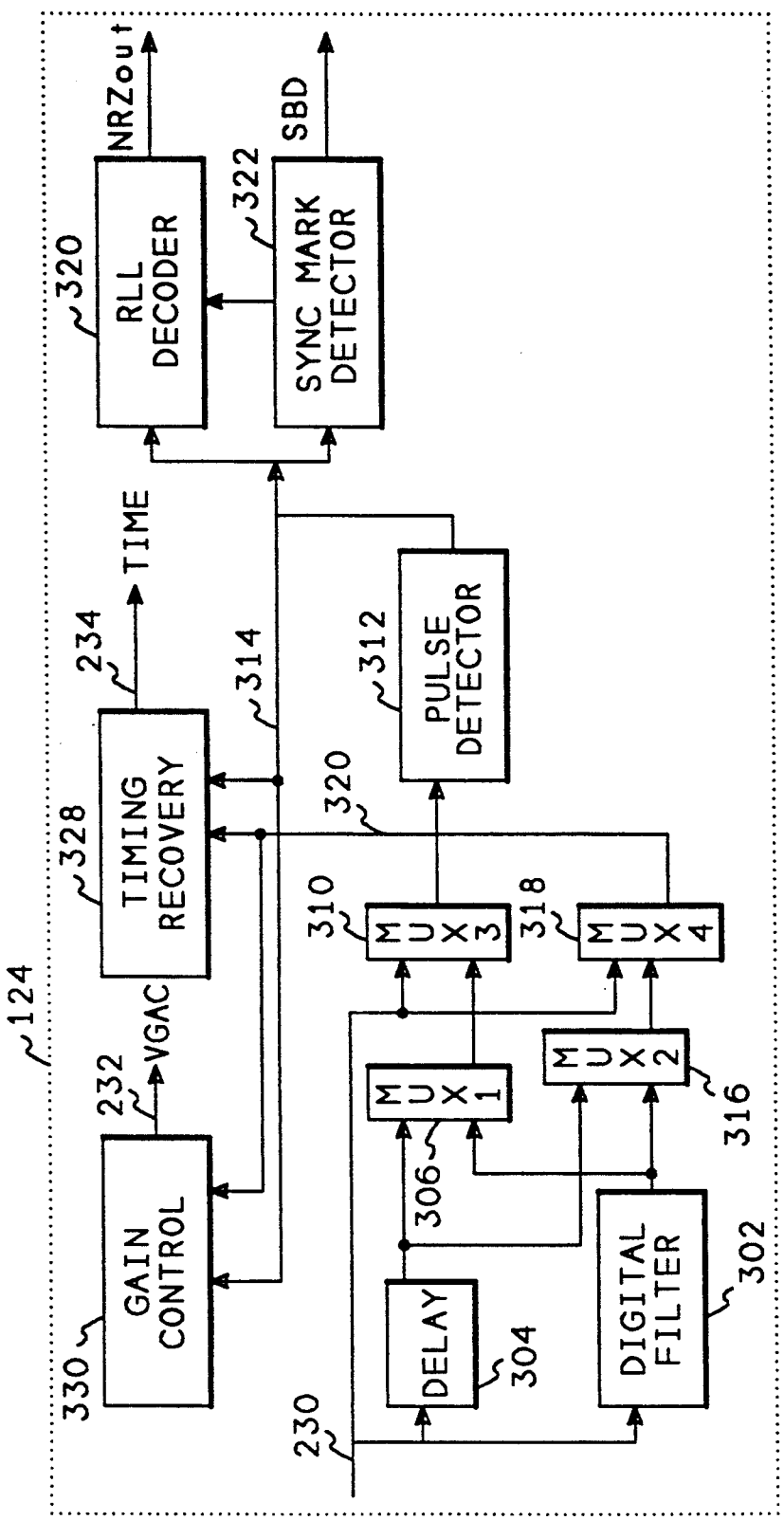
FIG. 3 shows a block diagram of the digital circuitry of the read channel containing the invention.

FIG. 3 shows a block diagram of the digital section 124 of the read channel 122 (FIG. 1). Referring now to FIG. 3, the digital data signal 230 from FIG. 2 is input to a delay circuit 304 and a digital filter circuit 302. The outputs of these two circuits are connected to multiplexers 306 and 316, whose outputs are connected to multiplexers 310 and 318 respectively. Multiplexers 310 and 318 also receive signal 230. Multiplexers 306 and 316 may be selected independently, however, multiplexers 310 and 318 are always selected together. In this manner, either the digital data signal 230 or the filtered/delayed signals may be selected for input to both a pulse detector 312 and a gain control circuit 330. If the filter signal is selected for either the pulse detector 312 or the gain control circuit 330, either the filter signal or the delay signal must be selected for input to the other of these circuits. The filter 302 inserts a delay into the digital data signal 230, so if one circuit selects the filtered signal, the other circuit input must be delay-compensated by selecting the delayed signal from circuit 304 or by also selecting the filter signal from filter 302.

The output of the pulse detector 312 is connected to a gain control circuit 330 which provides the gain feedback signal 232 that connects to FIG. 2. The output of the pulse detector 312 is also connected to the timing recover circuit 328 whose output 234 connects to the digital to analog converter 220of FIG. 2. The output of the pulse detector 312 may also be connected to a sync mark detector 322 and an RLL decoder 320, as shown in FIG. 3, or a more sophisticated data detector (not shown) may be connected to the sync mark detector 322 and the RLL decoder 320. The output of the RLL decoder 320 and the sync mark detector 322 are connected to the disk controller 114 (FIG. 1) through the bus 116.

Figure 4:
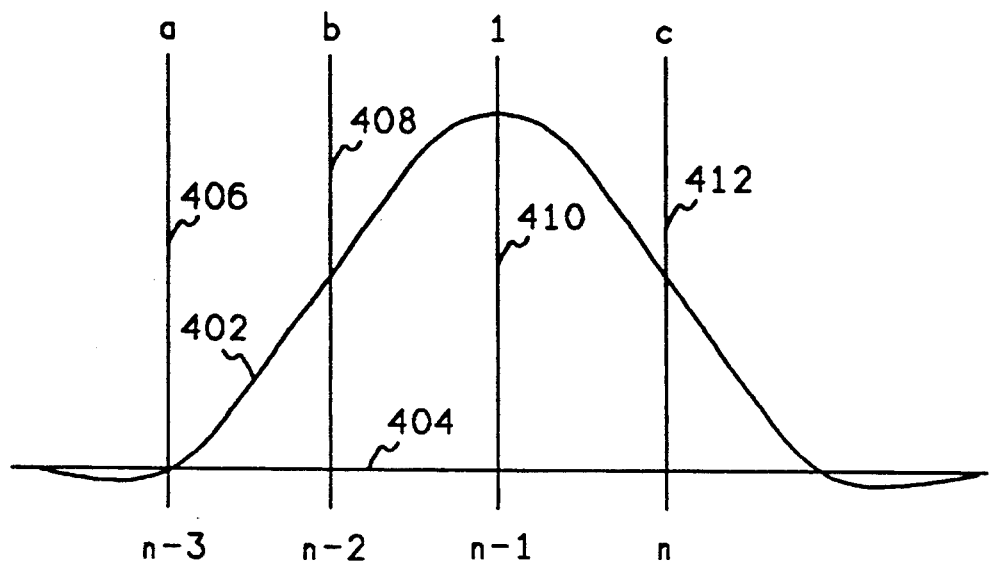
FIG. 4 shows a signal waveform and illustrates center sampling of the pulses.
Figure 5:
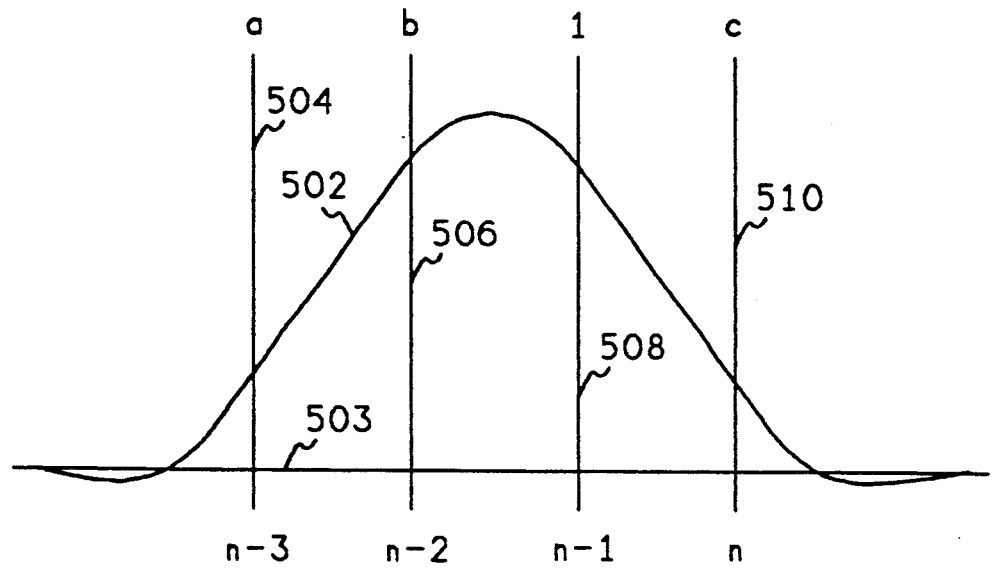
FIG. 5 shows a signal waveform and illustrates side sampling of the pulses.

The pulse detector 312, the timing recovery circuit 328, and the gain control circuit 330 are designed to process pulses using one of two types of sampling methods, selected by the user. The first sampling method is called center sampling wherein one of the samples taken will arrive at or near the center, or peak, of a pulse as shown in FIG. 4. The location of the sampling is controlled by the timing recovery block 328. In the other method of sampling, called side sampling, the timing recovery block 328 will adjust the timing of the VFO 222 (FIG. 2) such that two consecutive samples are taken wherein one of the two samples appears on one side of the peak of the pulse and the other of the two samples appears on the other side of the peak as shown in FIG. 5. The user of the system determines whether center sampling or side sampling is used by setting a bit in a control register through the interface 116 (FIG. 1).

For either center or side sampling, sampling can occur during two different time segments within a data record being read from the disk media. The first time segment during which sampling occurs is called acquisition mode, because it occurs when the gain control and timing control are acquiring the gain and timing relationships of the pulses. This occurs when the read head is passing a preamble portion of the data record which always has a known data pattern to facilitate acquisition of the timing and gain. When data is being transferred, a different mode is used for the pulse detector and timing recovery, called tracking mode, since data has an irregular and a priori unknown pattern of pulses.

Therefore, the pulse detector, timing recovery circuits, and gain control circuits are designed to process pulses under four separate conditions. The first condition is acquisition mode using side sampling, the second is acquisition mode using center sampling, third is tracking mode using side sampling, and fourth is tracking mode using center sampling.

FIG. 4 shows a signal waveform of an isolated pulse and illustrates center sampling of the pulse. Referring now to FIG. 4, a signal waveform 402 is shown having four samples taken with the sample identified by reference 412, at time n, being the most recent sample. Sample 410, at time n−1, is the sample just prior to the most recent sample, sample 408 is the next previous sample and sample 406 is the oldest of the four samples shown. Negative pulses would appear as a mirror image of FIG. 4. The samples taken of the pulse are also identified as "a", "b", "1", and "c". Sample "a" occurs at time n−3 of each pulse, sample "b" occurs at time n−2 of each pulse, sample "1", occurs at time n−1 of each pulse, and sample "c" occurs at time n of each pulse. The sample labeled "1" is so labeled because the gain control circuit adjusts the level of this sample to a nominal value of 1.

FIG. 5 shows a signal waveform of an isolated pulse and illustrates side sampling of the pulse. Referring now to FIG. 5, a signal waveform 502 is shown as a positive level above a baseline 503. Four samples are shown, with the most recent sample being sample 510. Sample 508 is the sample previous to the most recent, 506 is the next previous sample and sample 504 is the oldest of the four samples shown. These samples are also identified by the time references n through n−3.

Figure 6:
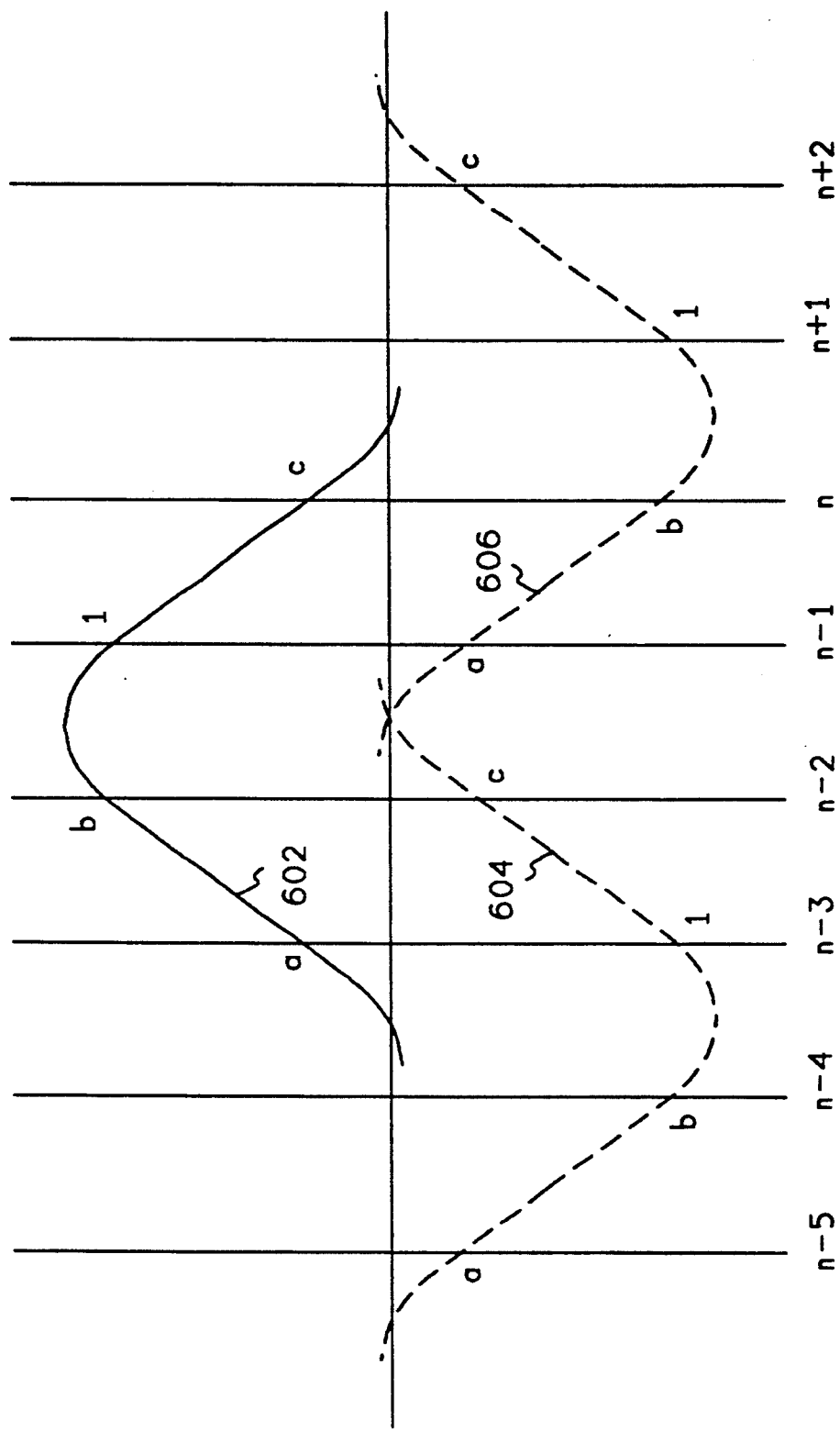
FIGS. 6 and 7 show signal waveforms to illustrate overlapping pulses.
Figure 7:
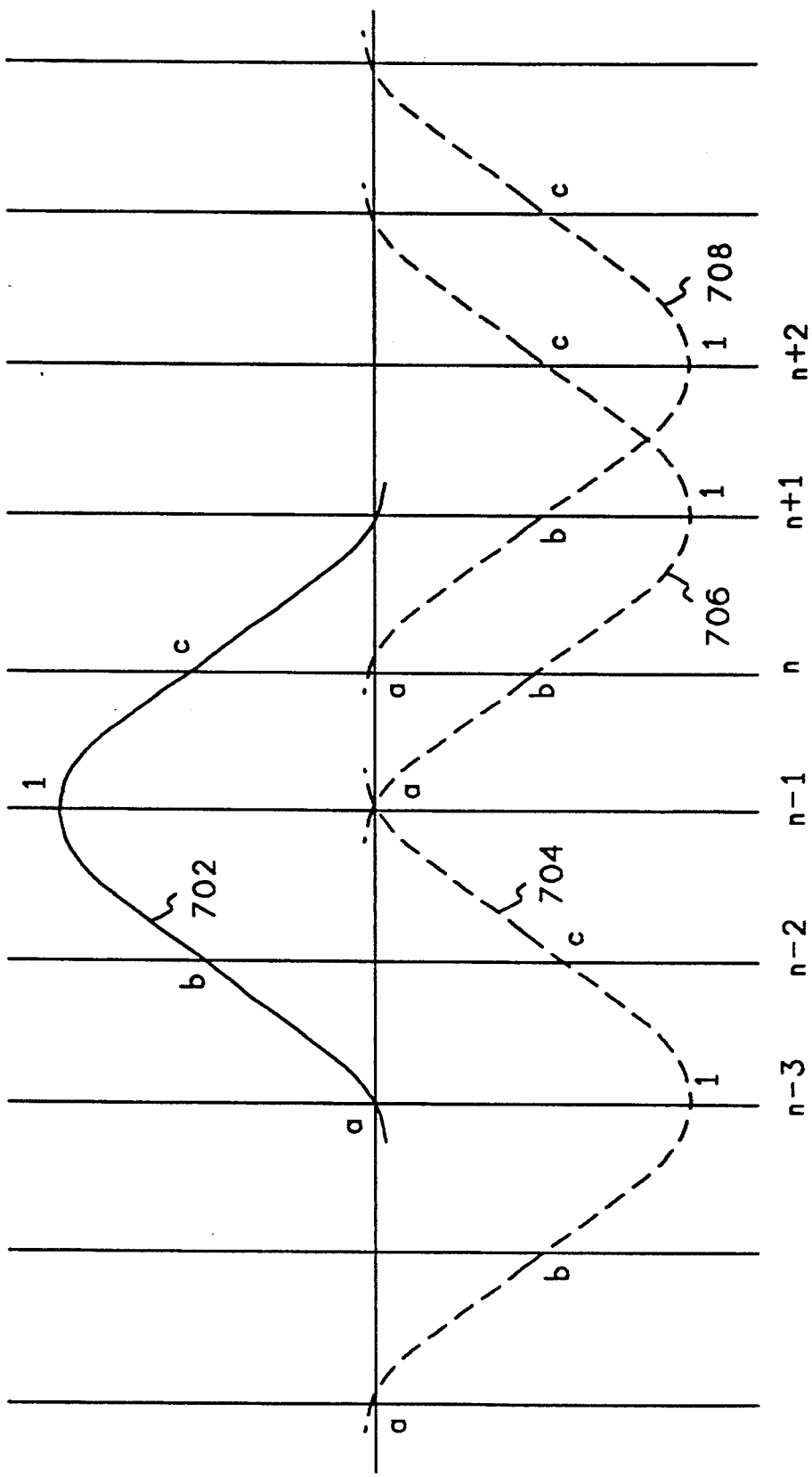

FIGS. 6 and 7 show waveforms and sample times for a typical pulse for side and center sampling, respectively, and will be used to illustrate the equations shown in Table 1.

Referring now to FIG. 6, a waveform 602 is shown with side sampling mode, with the four samples of the waveforms, "a", "b", "1", and "c", being identified for the value of the waveform at sample times n−3, n−2, n−1, and n, respectively. Because of the type of data recording code being used, pulses can never occur at two successive sampling times, thus pulses must be separated by at least two sample times. Therefore, the pulse illustrated by dashed line 604 is the closest a pulse could occur prior to the pulse 602 and the pulse identified by dashed line 606 is the earliest another pulse could occur after the pulse 602.

Referring now to Table 1, when a pulse is detected at time n, the gain error for side sampled (both acquisition and tracking) is determined by adding the samples $y_{n-1}$ and $y_{n-2}$, multiplying by −1 if the pulse detected at time n is a positive pulse (as indicated by the sign of $y_{n-1}$), and adding the gain set point $g_a$ for acquisition mode or $g_t$ for tracking mode. Since $y_{n-2}$ is nominally equal to 1, the gain set point $g_a$ or $g_t$ should nominally be set to $(1+b)$.

Since pulse 604 might have occurred two sample times earlier than pulse 602, and pulse 606 might occur two sample times later, the effects of these pulses must be considered in the equations. The term "$-(a+c)P_{n-2}$" accounts for the ISI effects of the pulse 604 and the pulse 606. Sample "c" of pulse 604 occurs at the same time as sample "b" of pulse 602. Therefore, if there was a peak detected at time n−2, i.e. $p_{n-2}$ is one, the gain is corrected by subtracting a constant value c to offset the "c" sample of pulse 604. This constant value is determined by calibration of the device and is input to the circuit through the interface 116 (FIG. 1).

Similarly, a pulse could occur two sample times after pulse 602, represented in FIG. 6 by pulse 606. For this pulse, the "a" sample occurs at the same time as the "1" sample of pulse 602. Therefore, the gain error is corrected by subtracting a constant a if there is a pulse at time n+2, i.e. if $P_{2+2}$ is one. Rather than wait two additional sample times to determine whether a pulse occurs at time n+2 before making a gain error measurement, subtraction of the constant is simply delayed two clock times. This is possible because of the small effect resulting from the pulse 606. This constant value, a, is also determined by calibration of the device and input to the circuit through the interface 116 (FIG. 1).

FIG. 7 shows waveforms when center sampling is being used. Table 1 shows the center sampling equations, and the center sampled equations are very similar to side sampled equations, except that in center sampling only the "1" sample of each pulse is used to determine gain error. Therefore, the center sampled equations remove the $y_{n-2}$ term from the side sampled equations. Thus for center sampling the nominal value of the gain set point $g_a$ or $g_t$ is 1.

The center sampled equations incorporate the same type of adjustment for ISI that was incorporated into the side sampled equations. As shown in FIG. 7, pulses 704, 706, and 708 can overlap the pulse 702, and if this occurs, the "a" sample of pulse 706 overlaps the "1" sample of pulse 702. Therefore, the center sampled tracking equation adds the term "$-a*P_{n-2}$" to compensate for the pulse 706, where a is the same constant described for the side sampling equations.

Figure 8:
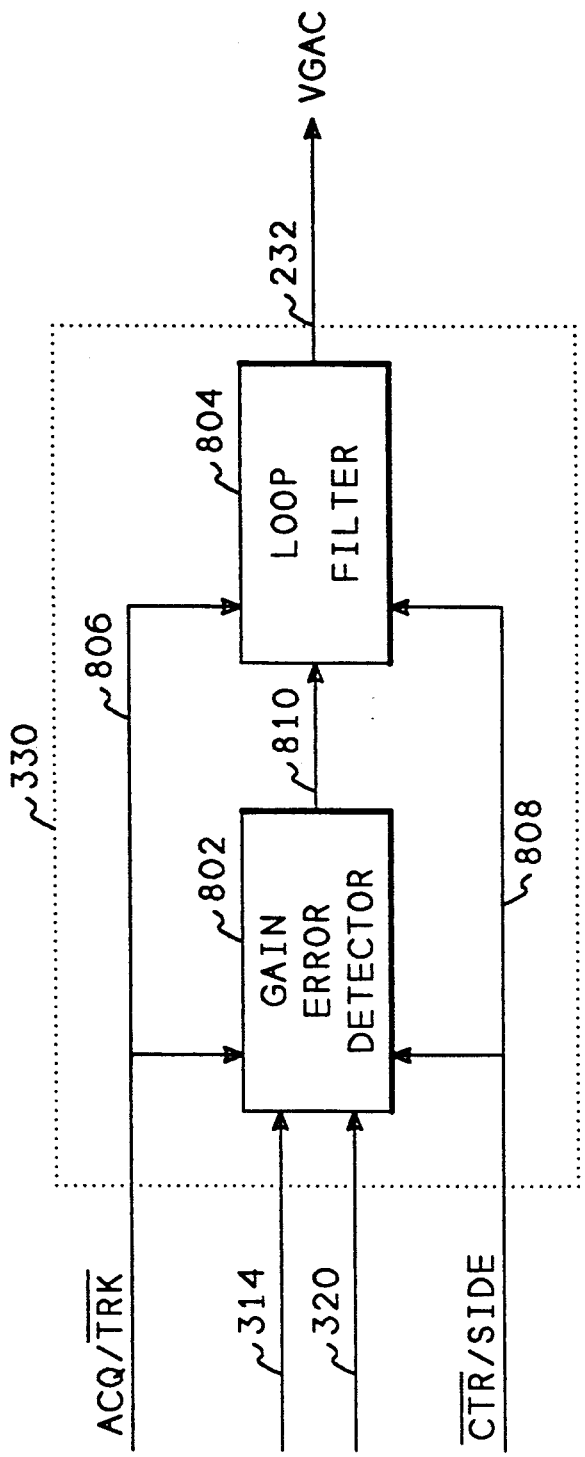
FIG. 8 shows a block diagram of the gain control circuit of FIG. 3.

FIG. 8 shows a block diagram of the gain control circuit 330 of FIG. 3. Referring now to FIG. 8, a gain error detector circuit 802 receives the input digital values over the bus 320, and the output 314 of the pulse detector. The gain error detector 802 applies the equations of Table 1 to create an amplitude error signal 810 which is connected to a loop filter 804. The loop filter 804 divides the amplitude error by a programmable value and integrates the result before returning the VGAC signal 232 to the circuit of FIG. 2.

Figure 9:
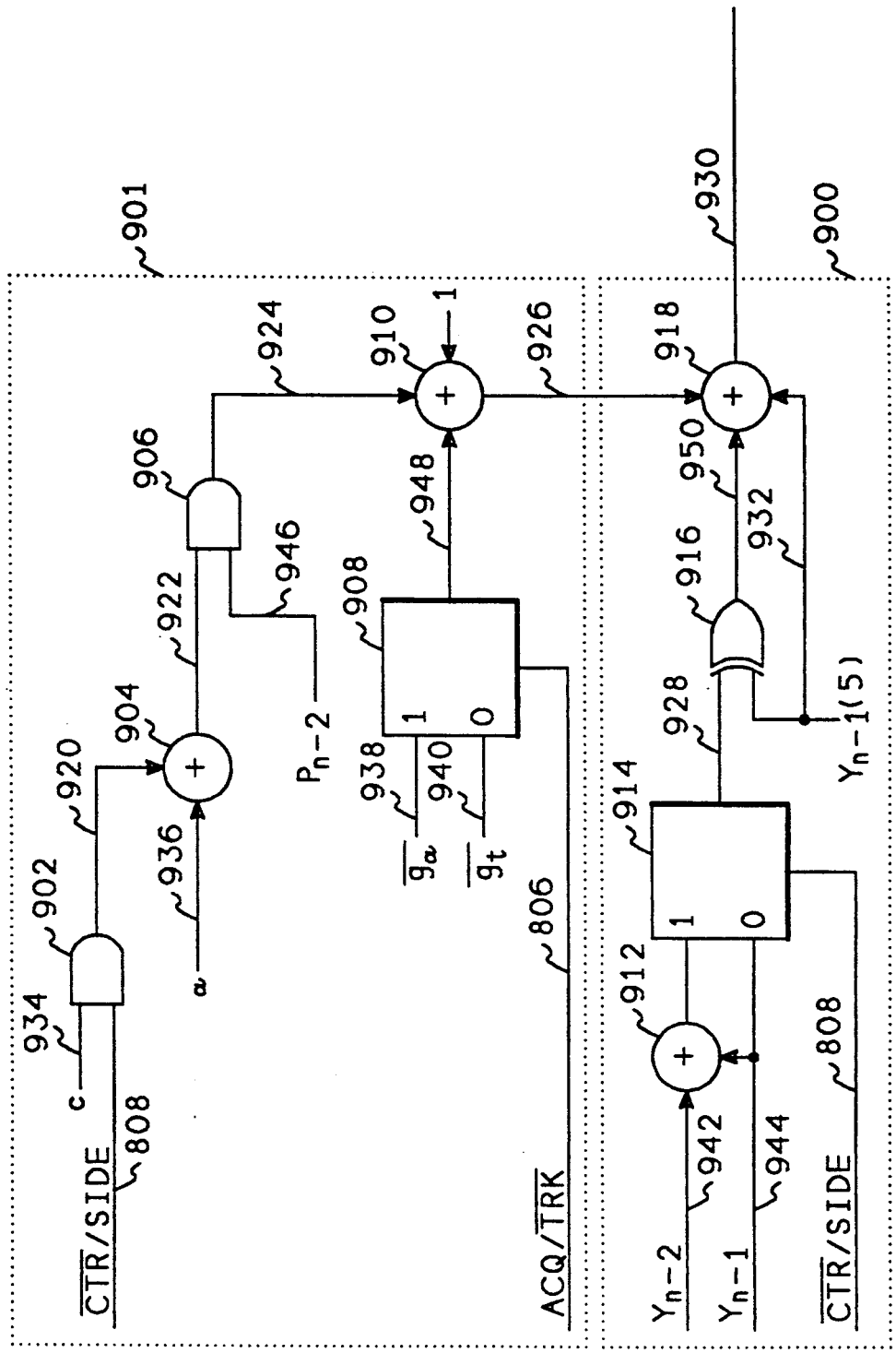
FIGS. 9 and 10 show a detained block diagram of the gain error detector of FIG. 8.
Figure 10:
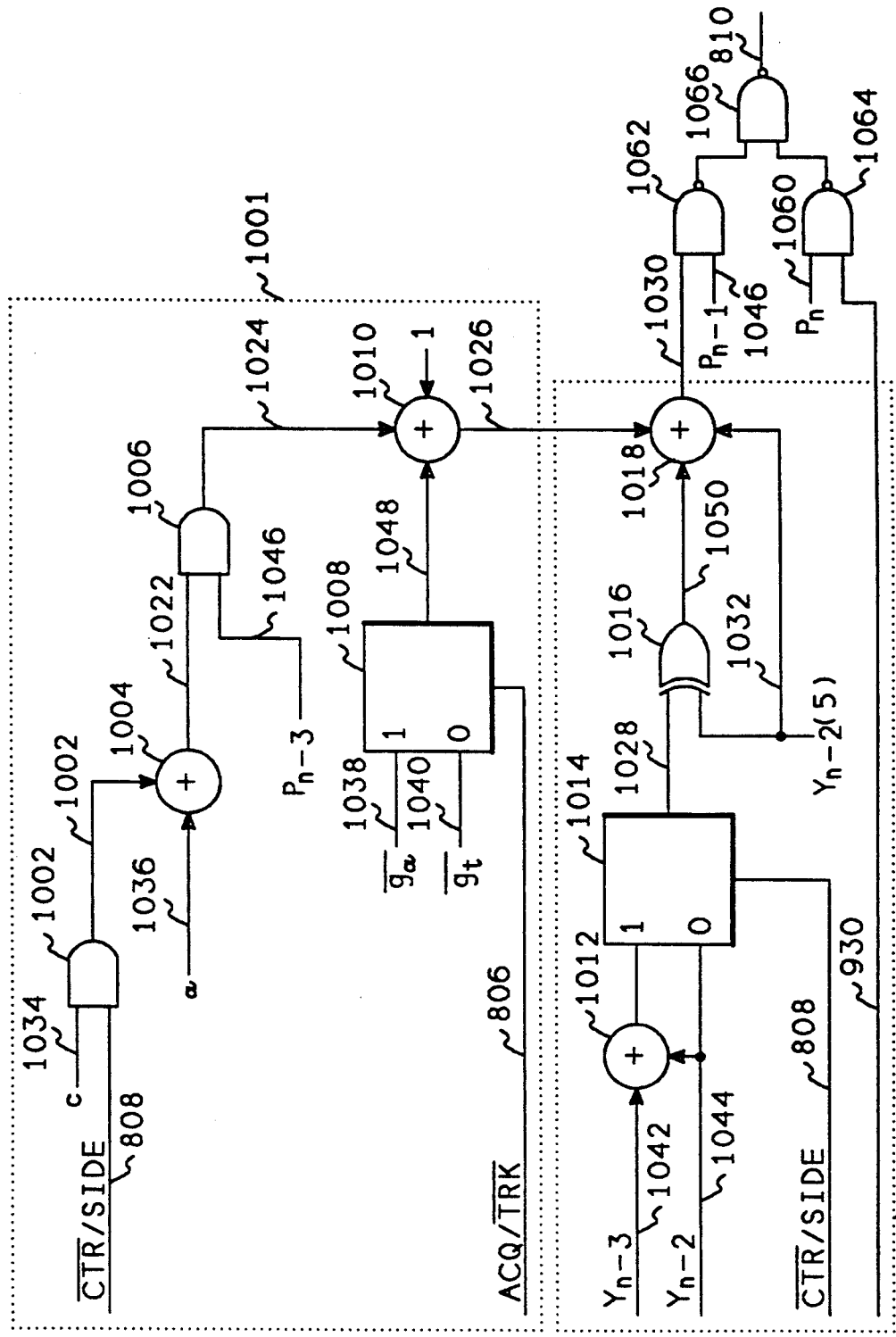

FIGS. 9 and 10 show a detailed block diagram of the gain error detector of FIG. 8. Referring now to FIG. 9, the circuit surrounded by dashed line 901 partially solves the equations of table 1, to produce the result of:

$g_t - (a+c)P_{n-2}$, or
$g_t - a^*P_{n-2}$, or
$g_a - (a+c)P_{n-2}$, or
$g_a - a^*P_{n-2}$ depending upon whether side or center sampling is being used and whether acquisition or tracking mode is being used. AND gate 902 inputs the "c" term to the adder 904 if side sampling is being used, and the adder 904 combines the "c" and "a" terms, or outputs only the "a" term if center sampling is being used. AND gate 906 passes the output of adder 904 to adder 910 if there was a pulse at time n−2. Multiplexer 908 selects the $g_a$ term or $g_t$ term, depending upon whether the system is in acquisition or tracking mode, and adder 910 subtracts this term from the output of AND gate 906 and sends an output 926 to an adder 918.

The circuit surrounded by dashed line 900 completes the solution by adding in the terms:

$-SGN(Y_{n-1})(Y_{n-1}+Y_{n-2})$ or
$-SGN(Y_{n-1})Y_{n-1}$ depending upon whether side or center sampling is being used. Multiplexer 914 selects the sum of $Y_{n-1}$ and $Y_{n-2}$ if side sampling is being used, or just $Y_{n-1}$ if center sampling is being used. This value is made negative by XOR gate 916 and the input 932 to adder 918 if the sign of $Y_{n-1}$ is negative as indicated by bit 5 of $Y_{n-1}$ (since 6-bit two's complement arithmetic is being used). Adder 918 completes the equation and sends the result to FIG. 10 as signal 930.

FIG. 10 solves the same equations, however, it solves them for the previous sample. The circuit of dashed line 1001 performs the same function as the circuit in dashed line 901, and the circuit in dashed line 1000 performs the same function as the circuit in dashed line 900, however, both work with the previous sample. The difference between the circuits of FIGS. 9 and 10 is in the inputs 946 (1046), 942 (1042) and 944 (1044) where FIG. 9 uses the current sample and FIG. 10 uses the previous sample.

NAND gates 1062, 1064, and 1066 combine the results of FIGS. 9 and 10, depending upon whether a pulse occurred in the previous or current sample. Because of the data encoding method used for recording data, two successive pulses cannot occur, so NAND gates 1062, 1064, and 1066 select one or the other, or neither in the case where no pulse occurred in either sample. The output of FIG. 10 is the amplitude error 810 discussed above, which is connected to the loop filter 804.

Figure 11:
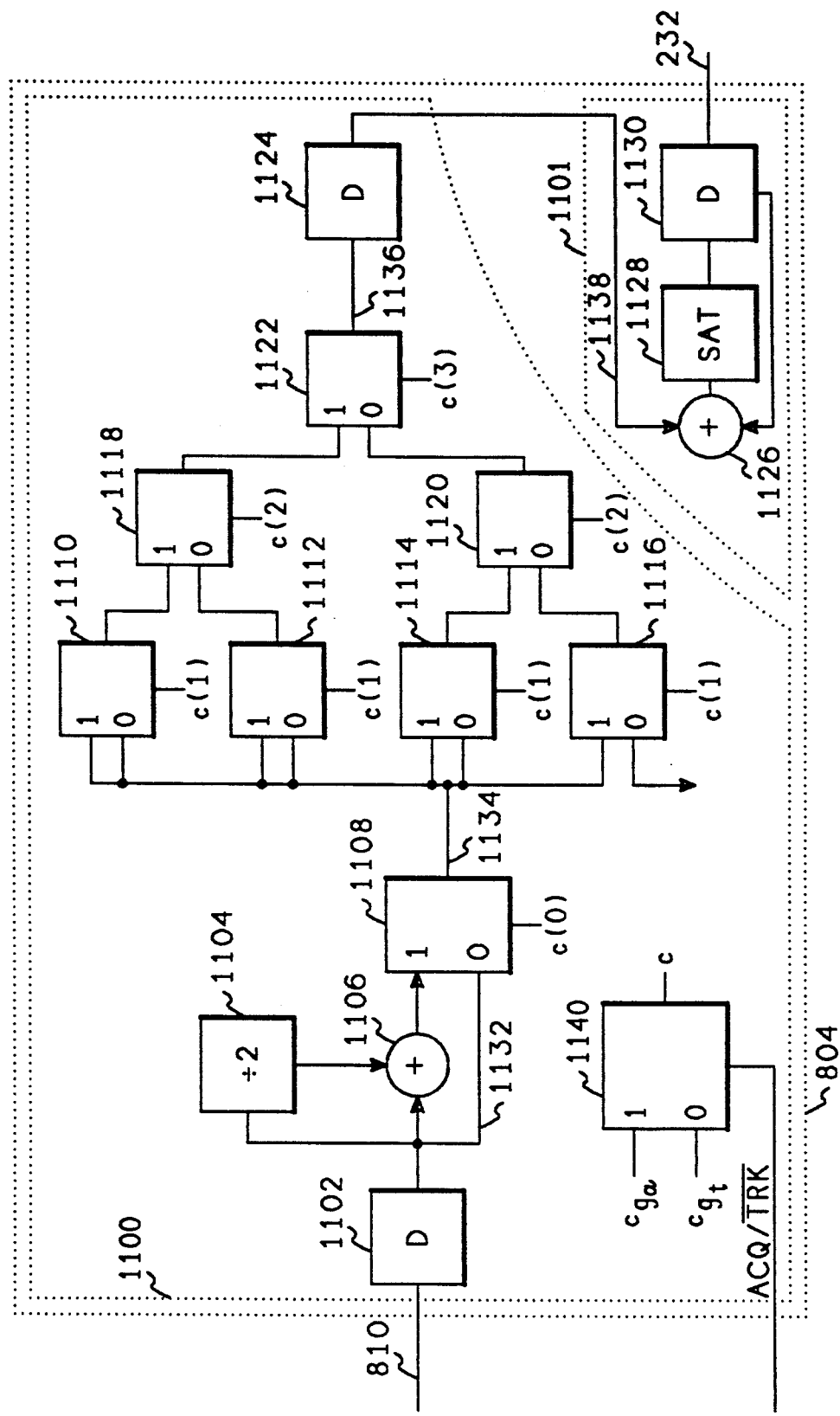
FIG. 11 shows a detailed block diagram of the loop filter circuit of FIG. 8.

FIG. 11 shows a block diagram of the loop filter 804. Referring now to FIG. 11, the circuit surrounded by dashed line 1100 multiplies the amplitude error 810 by a loop filter coefficient value, and the circuit surrounded by dashed line 1101 accumulates the adjusted amplitude error into a register without letting the value overflow or underflow.

Multiplexer 1140 selects either the acquisition or tracking loop filter coefficient. Register 1102 stores the amplitude error signal 810. Divide by two circuit 1104 and adder 1106 multiply the amplitude error signal by 3/2, and multiplexer 1108 selects either the amplitude error or the 3/2 value, depending upon bit zero of the loop filter coefficient selected by multiplexer 1140. Multiplexer circuits 1110, 1112, 1114, 1116, 1118, 1120, and 1122 further multiply the output of multiplexer 1108 by 1/128, 1/64, 1/32, 1/16, ⅛, ¼ or ½, based upon bits three, two, and one of the loop filter coefficient. In addition, one input to multiplexer 1116 allows the amplitude error to be set to zero, to allow the gain to remain constant. Register 1124 stores the adjusted amplitude error for an additional clock cycle before passing the value to adder 1126.

Adder 1126 adjusts the value of register 1130 by the output of register 1124, and SAT circuit 1128 ensures that the output of adder 1126 does not overflow or underflow. Instead of overflowing or underflowing, the SAT circuit 1128 causes the adder 1126 output to saturate. The output of register 1130 is the gain feedback signal input to the adder 210 of FIG. 2.

Having thus described a presently preferred embodiment of the present invention, it will now be appreciated that the aspects of the invention have been fully achieved, and it will be understood by those skilled in the art that many changes in construction and circuitry and widely differing embodiments and applications of the invention will suggest themselves without departing from the spirit and scope of the present invention. For instance the invention could be implemented with analog circuitry in place of much of the digital circuitry of the preferred embodiment. The disclosures and the description herein are intended to be illustrative and are not in any sense limiting of the invention, more preferably defined in scope by the following claims.

TABLE 1

|  | Acquistion | Tracking |
|---|---|---|
| Side Sampled | $-SGN(y_{n-1})^*(y_{n-1} + y_{n-2}) + g_a - (a + c)P_{n-2}$ | $-SGN(y_{n-1})^*(y_{n-1} + y_{n-2}) + g_t - (a + c)^*P_{n-2}$ |
| Center Sampled | $-SGN(y_{n-1})^*(y_{n-1}) + g_a - a^*P_{n-2}$ | $-SGN(y_{n-1})^*(y_{n-1}) + g_t - a^*P_{n-2}$ |

What is claimed is:

1. A gain control circuit for adjusting the gain of a variable gain amplifier that receives an analog signal, to cause an output of said variable gain amplifier to have a predetermined signal level at an occurrence of a pulse, said gain control circuit comprising:

amplitude sampling means for receiving said analog signal and for taking a plurality of amplitude samples of an amplitude of said analog signal, said amplitude samples being taken at times determined by a clock signal;

pulse detection means connected to receive said plurality of amplitude samples, wherein said pulse detection means determines whether a pulse occurred coincident with each of said plurality of amplitude samples;

sample selection means connected to an output of said amplitude sampling means and an output of said pulse detection means, said sample selection means for selecting, for each pulse detected by said pulse detection means, at least one of said plurality of amplitude samples, wherein said at least one amplitude sample has a predetermined relationship to a location of said pulse;

arithmetic means for comparing said at least one selected amplitude sample to a predetermined value and for creating an amplitude error measurement signal representative of a difference in amplitude between said at least one selected amplitude sample and said predetermined value; and conversion means connected between said arithmetic means and a gain control input of said variable gain amplifier, said conversion means for receiving said amplitude error measurement signal and converting said amplitude error measurement signal into a gain control signal connected to said gain control input.

2. The gain control circuit of claim wherein said sample selection means further comprises:
means for selecting two of said plurality of amplitude samples for each pulse detected by said pulse detection means; and
means for selecting a first of said two amplitude samples from amplitude samples occurring prior to said pulse, and a second of said two amplitude samples from amplitude samples occurring after said pulse.

3. The gain control circuit of claim 2 wherein said arithmetic means further comprises:
means for adding said first amplitude sample to said second amplitude sample to create a sum signal; and
means for subtracting said predetermined value from said sum signal to create said amplitude error measurement signal.

4. The gain control circuit of claim wherein said sample selection means further comprises:
means for selecting a single amplitude sample, from said plurality of amplitude samples, for each of said pulses; and
means for selecting said single amplitude sample as an amplitude sample that occurred coincident with said pulse.

5. The gain control circuit of claim 4 wherein said arithmetic means further comprises means for subtracting said predetermined value from said single amplitude sample to create said amplitude error measurement signal.

6. The gain control circuit of claim 1 wherein said amplitude sampling means comprises analog to digital converter means.

7. The gain control circuit of claim 1 further comprising:
at least one neighboring pulse compensation value corresponding to each neighboring pulse that, if present, would be sufficiently close to each of said pulses to change a shape of each of said pulses; and
arithmetic means for combining said at least one neighboring pulse compensation value with said amplitude error measurement signal when said corresponding neighboring pulse is present.

8. The gain control circuit of claim 1 wherein said conversion means comprises:
filter means connected to said amplitude error measurement signal for producing a gain error signal; and
sub conversion means for converting said gain error signal into said gain control signal.

9. The gain control circuit of claim 8 wherein said sub conversion means further comprises:

coarse gain value storage means for storing a constant value; and
arithmetic means for adding contents of said coarse gain value storage means to said gain error signal.

10. The gain control circuit of claim 8 wherein said filter means further comprises:
filter coefficient value storage means for storing a constant value;
arithmetic means for multiplying contents of said filter coefficient value storage means by said amplitude error measurement signal;
accumulator means for accumulating outputs of said arithmetic means for multiplying to produce said gain error signal.

11. The gain control circuit of claim 10 wherein said accumulator means further comprises saturation means whereby an output of said accumulator means is prevented from overflowing or underflowing.

12. The gain control circuit of claim 8 wherein said sub conversion means comprises:
digital to analog conversion means connected to receive said gain error signal; and
exponentiation circuit means for converting an output of said digital to analog conversion means to said gain control signal.

13. The gain control circuit of claim 8 wherein said sub conversion means comprises:
coarse gain value storage means for storing a constant value;
arithmetic means for adding contents of said coarse gain value storage means to said gain error signal to produce an adjusted gain error signal;
digital to analog conversion means connected to receive said adjusted gain error signal and convert said adjusted gain error signal to a digital value; and
exponentiation circuit means for converting said digital value to said gain control signal.

14. A gain error detector circuit that receives a plurality of amplitude samples of an input signal, and receives a plurality of pulse indicators, one pulse indicator corresponding to each of said amplitude samples, wherein said pulse indicator indicates whether a pulse occurred at said corresponding amplitude sample, said gain error detector circuit comprising:
sample selection means connected to receive said amplitude samples and further connected to receive said pulse indicators, said sample selection means for selecting, for each pulse indicator that indicates a pulse occurred, at least one of said plurality of amplitude samples, wherein said at least one amplitude sample has a predetermined relationship to said pulse indicator;
arithmetic means for comparing said at least one selected amplitude sample to a predetermined value and for creating an amplitude error measurement signal representative of a difference in amplitude between said at least one selected amplitude sample and said predetermined value; and
filter means connected to said amplitude error measurement signal for converting said amplitude error measurement signal to a gain error signal.

15. The gain error detector circuit of claim 14 wherein said sample selection means further comprises:
means for selecting two of said plurality of amplitude samples for each pulse indicator; and
means for selecting a first of said two amplitude samples from amplitude samples that occur prior to said pulse indicator, and a second of said two amplitude samples from amplitude samples that occur after said pulse indicator.

16. The gain error detector circuit of claim 14 wherein said sample selection means further comprises:
   means for selecting a single amplitude sample, from said plurality of amplitude samples, for each of said pulse indicators; and
   means for selecting said amplitude sample as an amplitude sample that occurred coincident with said pulse indicator.

17. The gain error detector circuit of claim 14 further comprising:
   at least one neighboring pulse compensation value corresponding to each neighboring pulse that, if present, would be sufficiently close to each of said pulse indicators to change a shape of a pulse represented by a pulse indicator; and
   arithmetic means for combining said at least one neighboring pulse compensation value with said amplitude error measurement signal when said corresponding neighboring pulse is present.

* * * * *